United States Patent [19]

Sakamoto et al.

[11] Patent Number: 5,159,550
[45] Date of Patent: Oct. 27, 1992

[54] ARTIFACT SUPPRESSION SYSTEM FOR MAGNETIC RESONNANCE IMAGING APPARATUS

[75] Inventors: Hidenobu Sakamoto; Masataka Nagao, both of Amagasaki, Japan

[73] Assignee: Mitsubishi Denki Kabushiki Kaisha, Tokyo, Japan

[21] Appl. No.: 460,049

[22] Filed: Jan. 2, 1990

[30] Foreign Application Priority Data

Apr. 20, 1989 [JP] Japan .................................. 1-98877
Jun. 29, 1989 [JP] Japan ................................ 1-165396
Jun. 30, 1989 [JP] Japan ................................ 1-166897

[51] Int. Cl.$^5$ ............................................. G06F 15/00
[52] U.S. Cl. ............................ 364/413.13; 324/307; 128/653.2
[58] Field of Search ............... 364/413.13; 128/653 A, 128/653.2; 324/307, 309

[56] References Cited

U.S. PATENT DOCUMENTS

| | | | |
|---|---|---|---|
| 4,651,096 | 3/1987 | Buonocore | 324/307 |
| 4,715,383 | 12/1987 | Ehman et al. | 324/309 |
| 4,728,890 | 3/1988 | Pattany et al. | 324/309 |
| 4,746,860 | 5/1988 | Satoh | 324/307 |
| 4,746,864 | 5/1988 | Satoh | 324/307 |

OTHER PUBLICATIONS

Matthaei, Dieter; Haase, Axel, *Magnetic Resonance in Medicine 4* "SYS-Flash. Systemic Saturation in Flash MR Imaging", pp. 302-305 (1987).

Pattany, Pradip M. et al., *Journal of Computer Assisted Tomography*, "Motion Artifact Suppression Technique (MAST) For MR Imaging", pp. 369-377 (May/Jun. 1987).

Pykett, Ian L., *Scientific American*, "NMR Imaging in Medicine" vol. 246, No. 5, pp. 78-88 (May, 1982).

Primary Examiner—Roy N. Envall, Jr.
Assistant Examiner—Laura Brutman
Attorney, Agent, or Firm—Leydig, Voit & Mayer

[57] ABSTRACT

An artifact suppression system for a magnetic resonance imaging apparatus, comprising static field application means for applying a static field to a subject, RF pulse application means for applying RF pulses, gradient field application means for applying gradient fields which consist of a slice field for designating a tomographic slice, a phase encode field for affording a phase encode magnitude, and a signal read field for encoding a frequency, and sequence control means for controlling a signal acquistion sequence which acquires a magnetic resonance signal from the designated tomographic slice of the subject, and a saturation sequence which saturates spins of movable objects to traverse the designated tomographic slice of the subject for the signal acquisition, before execution of the signal acquisition sequence.

8 Claims, 15 Drawing Sheets

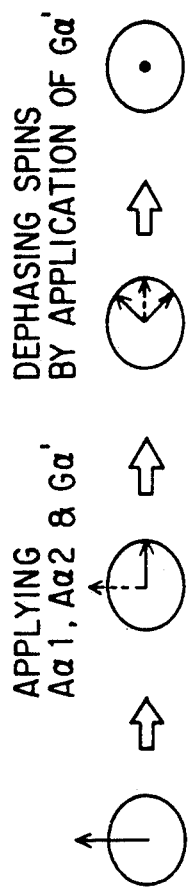
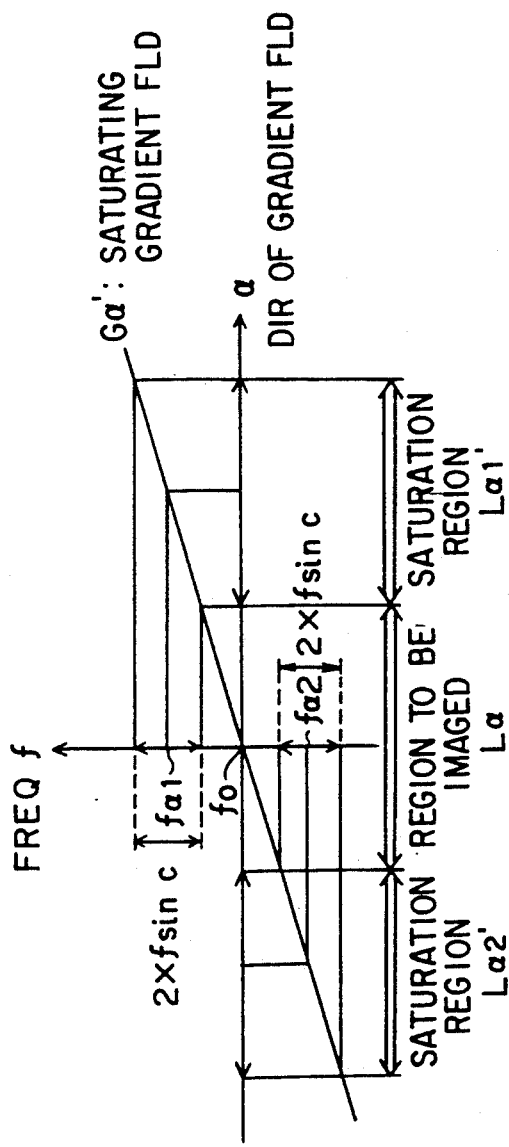

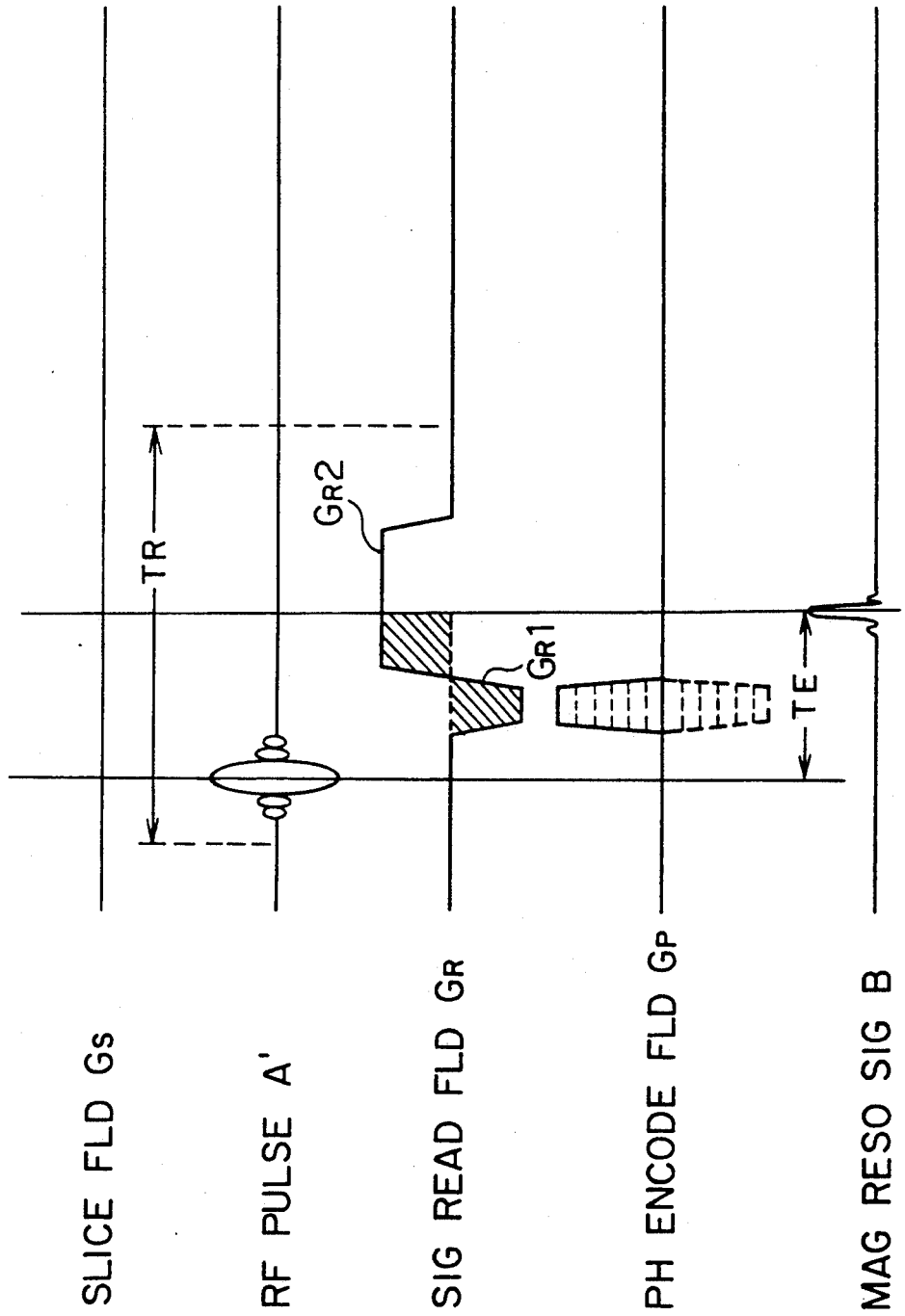

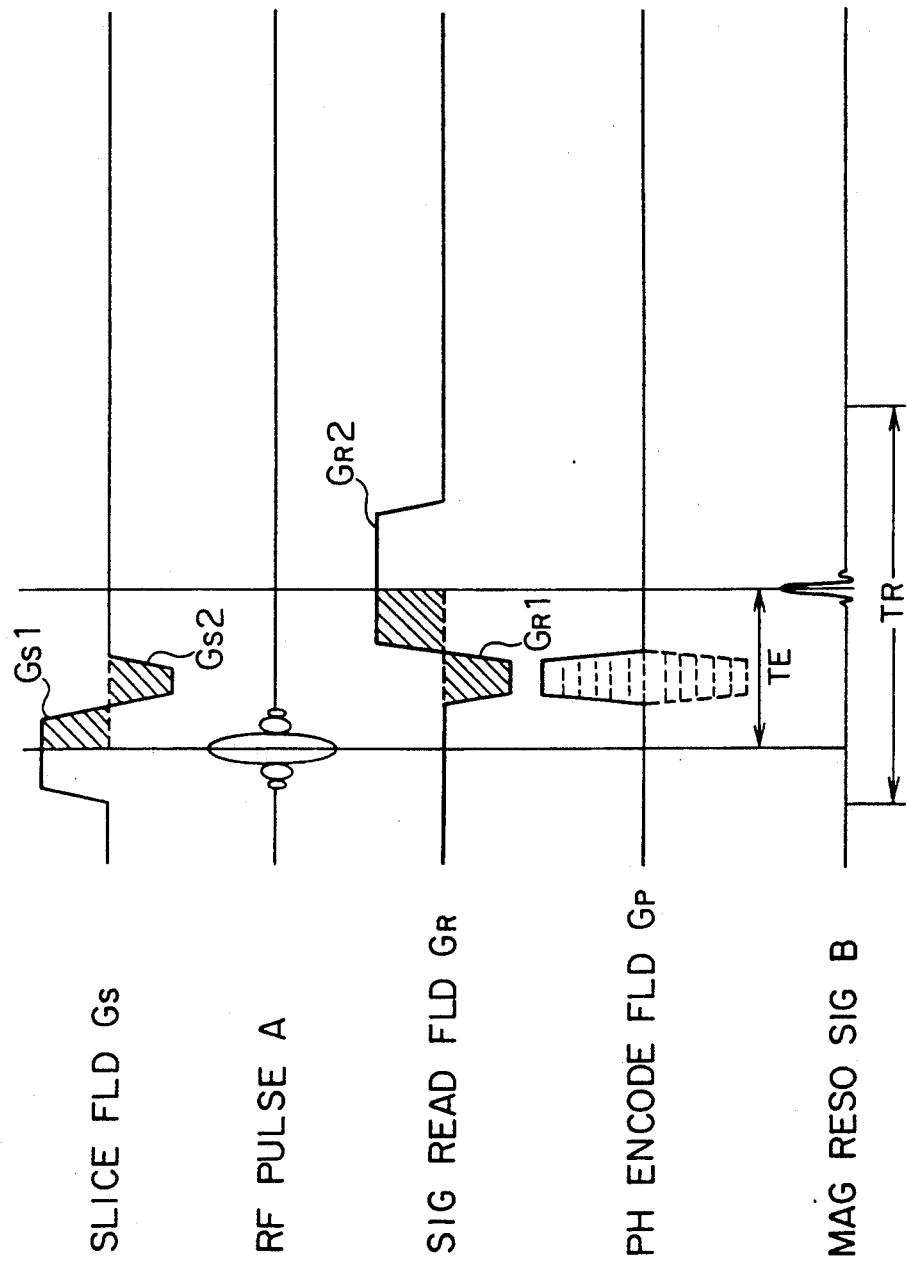

ARTIFACT SUPPRESSION SYSTEM FOR MAGNETIC RESONNANCE IMAGING APPARATUS

BACKGROUND OF THE INVENTION

This invention relates to a magnetic resonance imaging apparatus which forms the spectrum or tomographic image of a subject by the use of NMR (nuclear magnetic resonance), ESR (electron spin resonance) or the like. More particularly, it relates to an artifact suppression system for the magnetic resonance imaging apparatus as can suppress artifacts appearing when a movable object outside a field of view has overlapped to a tomographic slice, and so on.

Heretofore, there has been well known a magnetic resonance imaging apparatus wherein radio-frequency magnetic field pulses (hereinbelow, termed "RF pulses") perpendicular to a static magnetic field and gradient magnetic fields of three orthogonal axes (X, Y and Z) are applied to a subject lying within the static magnetic field, and a predetermined number of image data sets strings based on magnetic resonance signals induced from the subject are acquired, whereby the desired tomographic image subject is reconstructed by a Fourier transform.

FIG. 1 is a block diagram showing a conventional magnetic resonance imaging apparatus. Referring to the figure, a subject such as human body 1 is arranged through an examination bed 3 within a static field generator 2 which generates a static magnetic field in a direction of Z axis.

A radio-frequency coil 4 which supplies RF pulses A (radio-frequency energy) on the subject 1 and which receives magnetic resonance signals (for example, NMR signals) B from the subject 1, is connected to a transmitter 7 and a receiver 8 by way of a matching unit 5 and a transmission/reception switching unit 6.

Gradient field coils 9, 11 and 13 for respectively applying gradient magnetic fields $G_R$, $G_P$ and $G_S$ in the directions of three orthogonal axes to the subject 1 are respectively connected to gradient field power sources 10, 12 and 14. Here, the X-axial gradient field is used as a signal read field $G_R$ for encoding a frequency, the Y-axial gradient field as a phase encode field $G_P$ for affording a phase encode magnitude, and the Z-axial gradient field as a slice field $G_S$ for designating a tomographic slice.

A sequence controller 15 controls in a predetermined sequence, all the devices which include the examination bed 3, transmitter 7, receiver 8, and gradient field power sources 10, 12 and 14. A computer 16 which is connected to the receiver 8 and the sequence controller 15, is furnished with a console 17 for inputting parameters etc. required for the construction of an image This computer 16 generates control data for constructing the image, and it executes arithmetic processing and post-processes of a magnetic resonance signal B. An image display unit 18 for displaying the tomographic image is connected to the console 17.

Now, conventional magnetic resonance imaging which employs the apparatus in FIG. 1 will be explained with reference to a pulse sequence diagram of FIG. 2. Incidentally, the pulse sequence in FIG. 2 is stored as part of a program in the computer 16 in FIG. 1 beforehand and is executed by the sequence controller 15. Illustrated here is a case where the magnetic resonance signals B are received by the spin echo technique, and where the tomographic image is constructed from image data based on the magnetic resonance signals B by the use of the two-dimensional Fourier transform method.

First, the subject 1 is inserted inside the radio-frequency coil 4 and the gradient field coils 9, 11 and 13. The radio-frequency coil 4 and the Z-axial gradient field coil 13 are driven, whereby a radio-frequency field pulse (RF pulse) A1 having a selective frequency and a slice field $G_S1$ are applied to the subject 1. The RF pulse A1 turns a magnetization of spins 90° ordinarily, and is called the "90° pulse". Thus, nuclear spins within the desired tomographic slice of the subject 1 are supplied with radio-frequency energy, and the phases of the spins begin to be disordered at the central (peak) position of the RF pulse A1.

Next, the Y-axial gradient field coil 11 is driven to apply the phase encode field $G_P$ and to disorder the phases of spins in the Y-axial direction of the tomographic slice, and the X-axial gradient field coil 9 is switched to apply a signal read field $G_R1$.

Subsequently, an RF pulse A2 having a flip angle of 180° is impressed in conjunction with a slice field $G_S2$ is applied. On this occasion, for the purpose of putting the phases of the spins in order into a slice direction, the slice field $G_S2$ is applied in a form extended as indicated by a hatched part, not in a pulse waveform which is symmetric with respect to the peak of the 180° pulse A2. The pulse area of the hatched part agrees with that of the part of the slice field $G_S1$ after the peak of the 90° pulse A1 (a hatched part in the figure).

Lastly, the magnetic resonance signal (a spin echo signal) B is received while a signal read field $G_R2$ which is identical in polarity to the field $G_R1$ is kept applied. This magnetic resonance signal B is fed from the radio-frequency coil 4 into the computer 16 through the transmission/reception switching unit 6 by way of the receiver 8.

In the signal acquisition sequence, the magnetic resonance signal B becomes its peak value at the point of time at which the pulse areas indicated by the hatched parts of the signal read fields $G_R1$ and $G_R2$ have agreed, that is, at which an echo time interval TE has lapsed from the peak time of the 90° pulse A1. In addition, the timing at which the magnetic resonance signal B becomes the peak depends upon the application timings of the signal read fields $G_R$ and the RP pulses A, and the 180° pulse A2 is applied so as to ensure its peak at the point of time at which $\frac{1}{2}$ of the echo time interval TE has lapsed from the peak time of the 90° pulse A1.

The image data items are acquired in such a way that the magnetic resonance signal B is sampled up to a predetermined number of sampling points during the application of the signal read field $G_R2$.

The above signal acquisition sequence is repeated the number of times (the number of signal acquisition) corresponding to a predetermined number of pixels N (for example, 256) while the phase encode magnitude equivalent to the pulse area of the phase encode field $G_P$ is being successively changed at predetermined pitches (refer to broken lines and an arrow). Accordingly, in a case where the number of pixels of the tomographic image which is finally constructed is N×N, the number of the sampling points of the magnetic resonance signal B at one time is at least N, and the number of times of the signal acquisition of the magnetic resonance signals B is N.

After executing the N times of signal acquisition sequence, the computer 16 subjects the pulse train of the image data based on the magnetic resonance signals B to the two-dimensional Fourier transform and thus reconstructs the tomographic image of the desired matrix size $N \times N$, which is displayed on the image display unit 18.

By way of example, the intensity of the phase encode field $G_P$ for every steps is successively changed so as to satisfy the following equation when $\gamma$ is let denote the nuclear magnetic resonance ratio, $L_P$ the field of view (hereinbelow, also termed the "FOV" simply) in a phase encode direction, and $N_P$ the matrix size in the phase encode direction:

$$\gamma L_p \int /G_p \cdot dt = 2 \, m\pi \tag{1}$$

where $m = N_p/2, N_p/2-1, \ldots, 1, 0, -1, \ldots$ and $-N_p/2+1$ Accordingly, the variation $\Delta G_p$ of the phase encode field $G_p$ becomes:

$$\int \Delta G_p \cdot dt = 2\pi/(\gamma \cdot L_p) \tag{2}$$

The computer 16 subjects the image data items based on the plurality of magnetic resonance signals B to the two-dimensional Fourier transform and reconstructs them as the tomographic image of the desired slice whose matrix size is $N_R \times N_p$ where $N_R$ is the matrix size of frequency encoding direction.

Besides, in case of multislice imaging, immediately after the pulse sequence in FIG. 2, a signal acquisition sequence is executed using RF pulses A at a different carrier (transmission) frequency, thereby to acquire the magnetic resonance signals B of another slice.

SUMMARY OF THE INVENTION

The magnetic resonance imaging in the prior art is constructed as described above. Therefore, when a movable object such as blood has flowed into the FOV during the signal acquisition, fluid spins contribute to the magnetic resonance signal B. This has led to the problem that an artifact appears to degrade the image quality, so a diagnosis cannot be made correctly.

Likewise, when a body motion of the subject 1, such as respiration, has occurred during the imaging data collection, an artifact appears due to the spins of a body motion part outside the FOV. A further problem is that, in the case of applying the multislice imaging in which a plurality of slices are involved, an artifact appears due to the overlapping part of slices.

This invention has been made in order to solve the problems as mentioned above, and has provided high quality magnetic resonance imagings which are free from artifacts ascribable to movable objects for example body motions and to the overlapping parts of slices in multislice imaging.

BRIEF DESCRIPTION OF THE DRAWINGS

FIGS. 5(a), 5(b), 5(c) and 5(d) are explanatory diagrams each showing the state of a spin in a saturation region which is influenced by a saturation sequence depicted in FIG. 3;

FIG. 6 is an explanatory diagram showing saturation regions which are defined by means of saturating gradient magnetic fields and saturating RF pulses in the first embodiment;

FIG. 15(A) is a pulse sequence diagram showing a dummy sequence according to the third embodiment of this invention;

FIG. 15(B) is a pulse sequence diagram showing a signal acquisition sequence which is executed after the dummy sequence in FIG. 15(A);

Throughout the drawings, the same symbols indicate identical or equivalent portions.

DESCRIPTION OF THE PREFERRED EMBODIMENTS

The first embodiment of this invention includes a signal acquisition sequence followed by a saturation sequence which applies a saturating region selection field in the direction of phase encode and a pair of saturating RF pulses having transmission frequencies unequal to each other; a saturating region selection field in the direction of signal reading and a pair of saturating RF pulses having transmission frequencies unequal to each other; and a saturating region selection field in the direction of slice selection and a pair of saturating RF pulses having transmission frequencies unequal to each other; and in which saturating fields, are further kept applied after the applications of the respectively corresponding pairs of saturating RF pulses, whereby spins outside a tomographic slice are saturated beforehand.

In the first embodiment, before the signal acquisition sequence is executed, the spins outside the field of view (the region to-be-imaged) concerning the phase encode field, signal read field and slice field are selectively saturated. Thus, in the ordinary signal acquisition sequence subsequent to the saturation sequence, the signal intensities of the spins outside the field of view become very low and hardly contribute to magnetic resonance signals. Accordingly, various artifacts ascribable to the spins outside the field of view are suppressed, and a tomographic image of high image quality is obtained.

Figure 1:
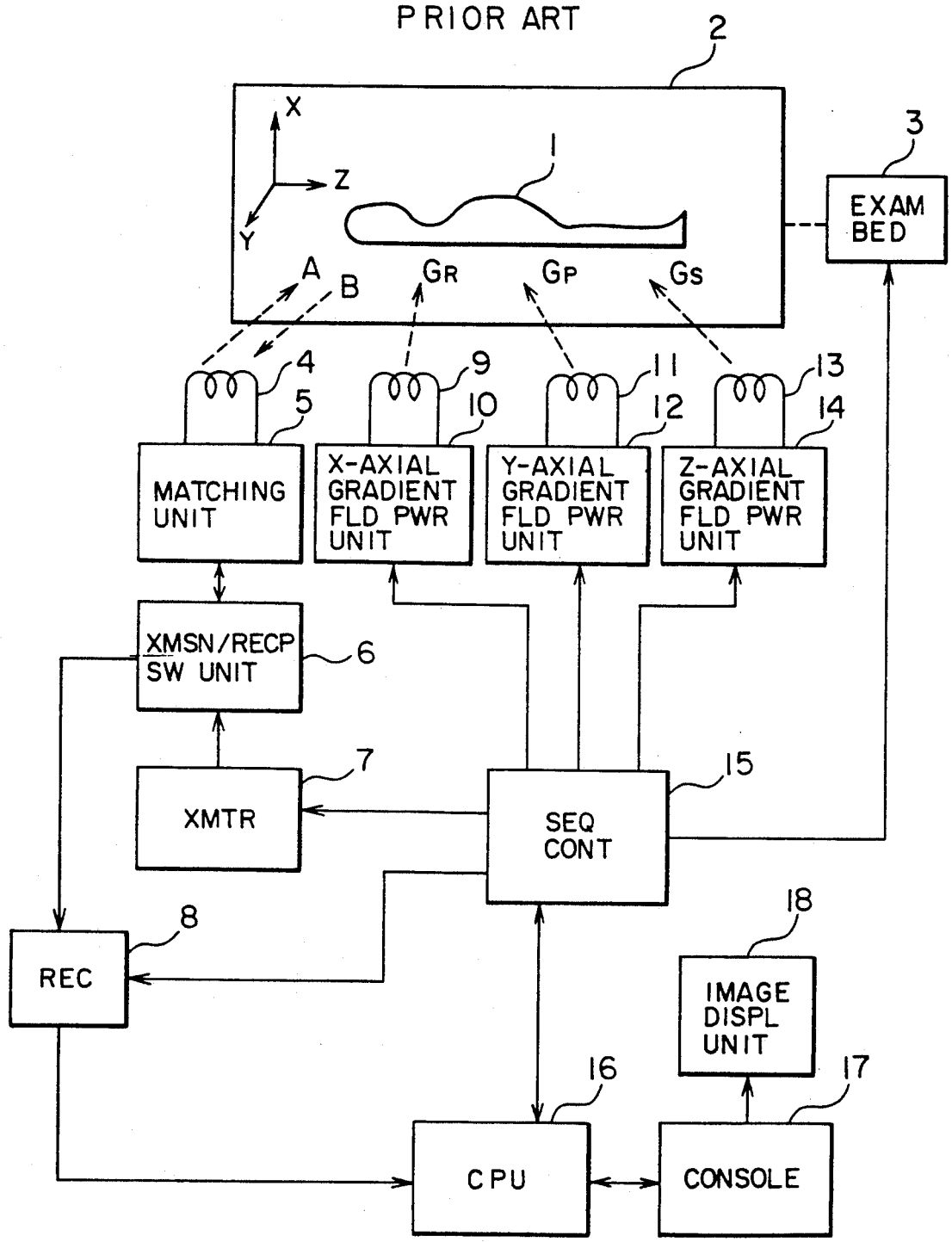
FIG. 1 is a block diagram of a conventional MR (magnetic resonance) imaging apparatus.
Figure 2:
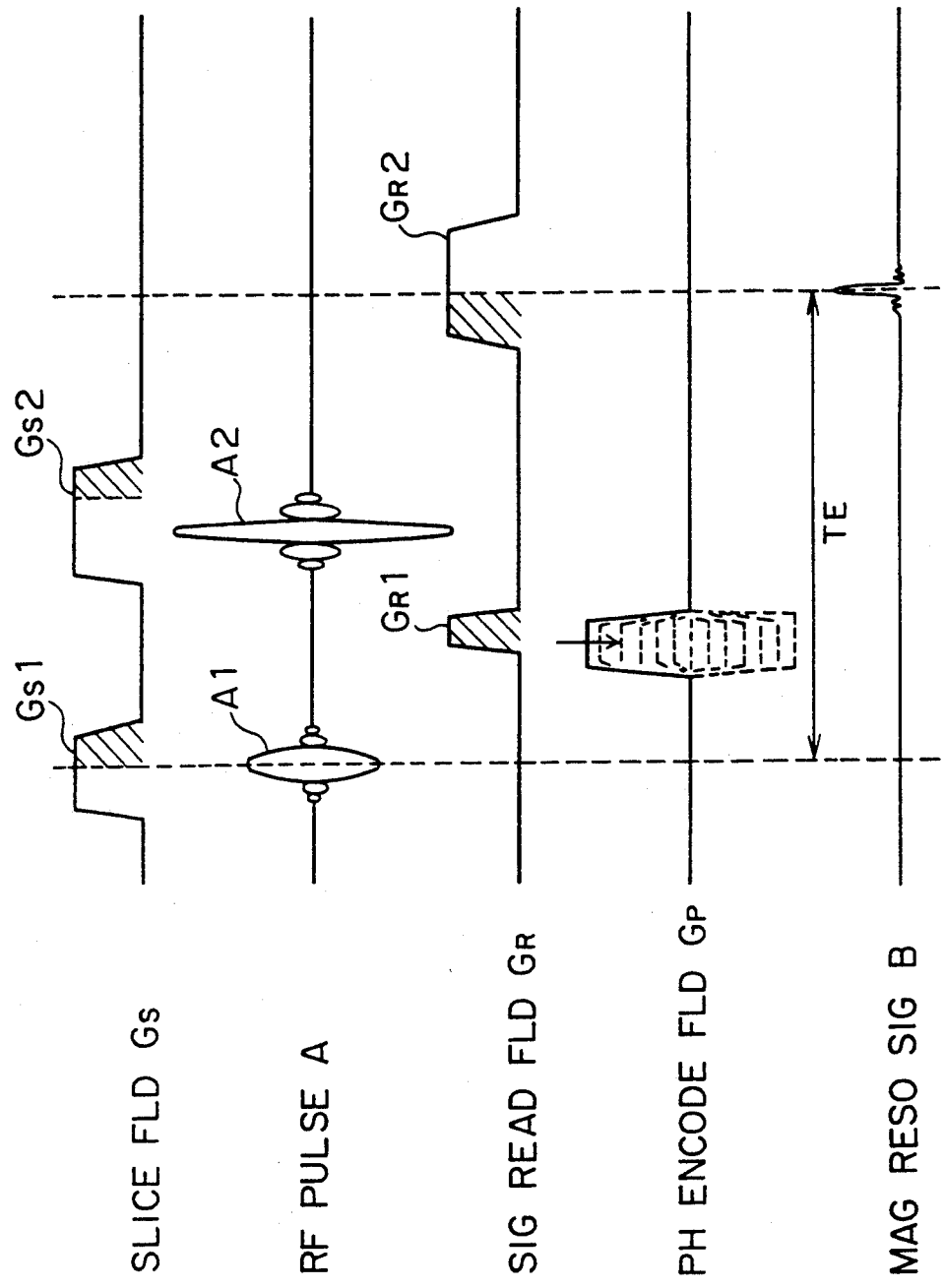
FIG. 2 is a pulse sequence diagram showing the operation of the MR imaging apparatus in the prior art.

Now, the embodiment of this invention will be described with reference to the drawings by taking as a case where the magnetic resonance signals B of multislice imaging are received by the spin echo technique and where an image is constructed by the two-dimensional Fourier transform method. A magnetic resonance imaging apparatus to which this invention is applied is identical as shown in FIG. 1, and some of programs within the sequence controller 15 or the computer 16 in FIG. 1 may be replaced, or new programs may be added. In the case illustrated here, the conventional multislice imaging is employed as a signal acquisition sequence.

Figure 3:
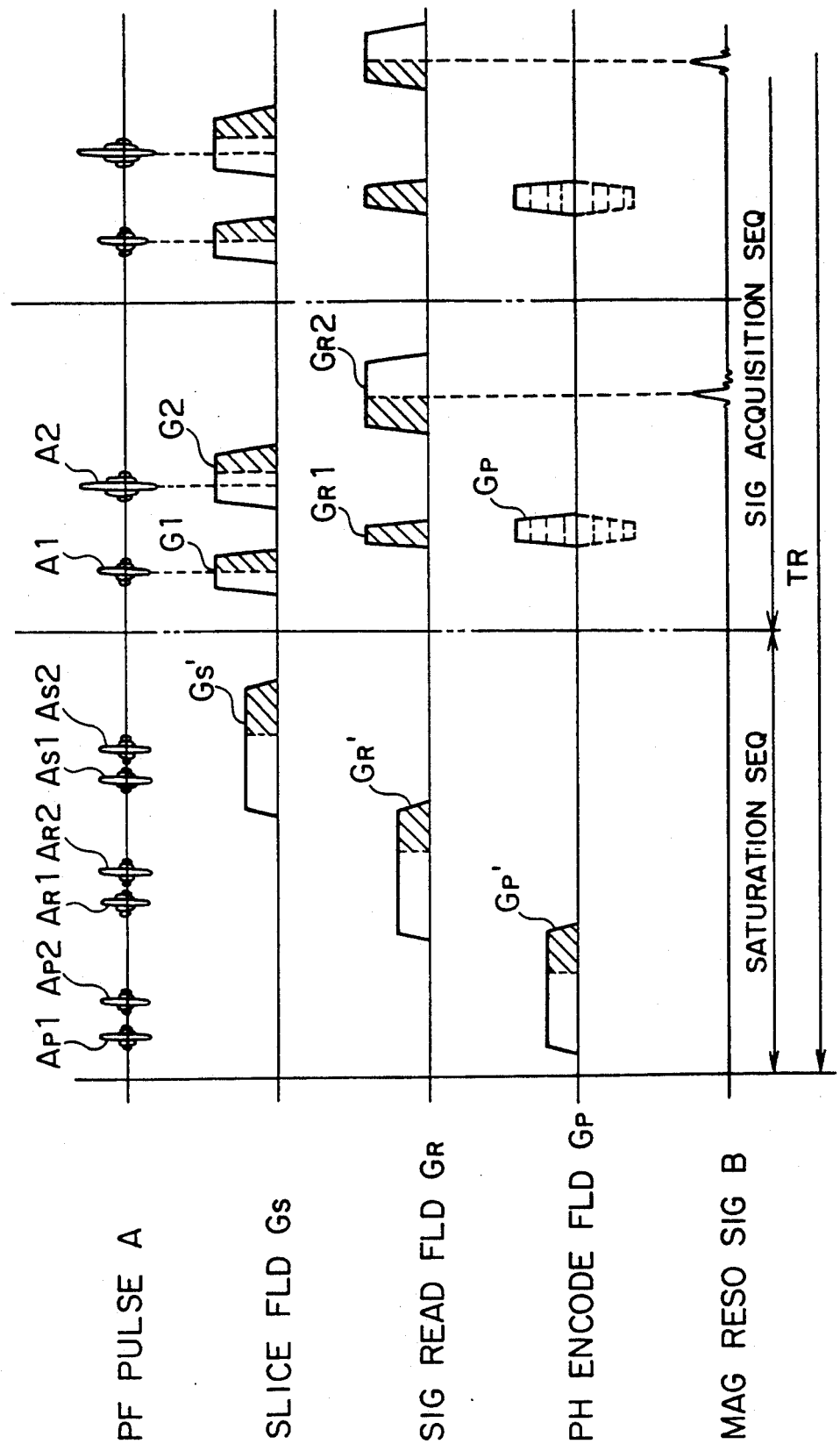
FIG. 3 is a diagram of a pulse sequence showing the operation of the first embodiment of this invention.
Figure 4:
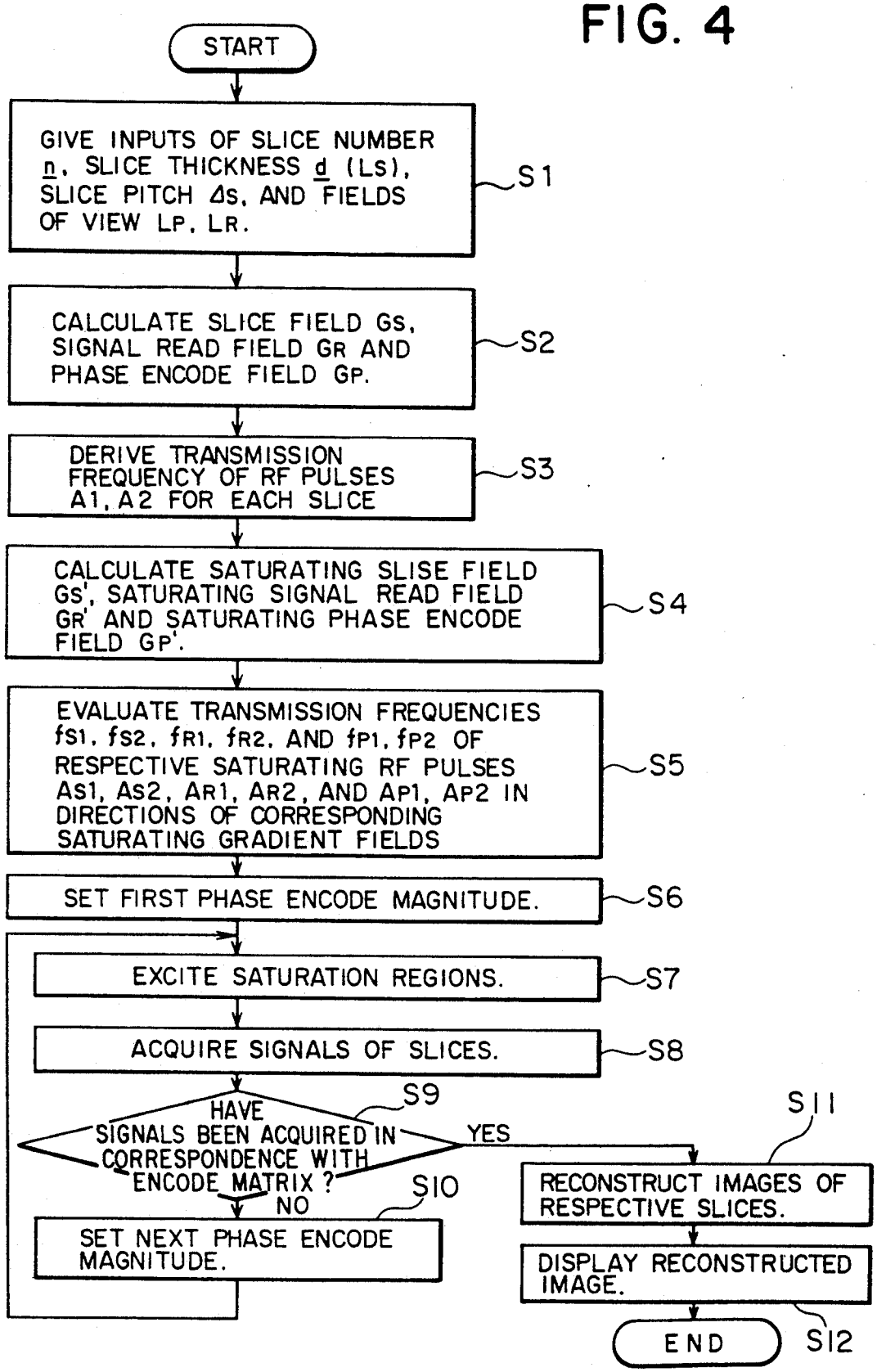
FIG. 4 is a flow chart for forming an image in accordance with the pulse sequence in FIG. 3.

FIG. 3 is a pulse sequence diagram showing the first embodiment, while FIG. 4 is a flow chart showing the operations of the sequence controller 15 and computer 16 in this embodiment.

First, the number n of slices, the thickness d of each of the slices (the field of view $L_S$ in a slice direction), the pitch $\Delta s$ of the slices, the FOV $L_p$ in a phase encode direction, and the FOV $L_R$ in a frequency encode direction are input through the console 17, thereby to initialize the apparatus (step S1).

On the basis of the input values, the computer 16 calculates the intensities of a slice field $G_S$, a signal read field $G_R$ and a phase encode field $G_p$ for use in the signal acquisition sequence (step S2), and it also derives the transmission frequency $f_0$ of RF pulses A1 and A2 corresponding to the respective slices (step S3).

Similarly, the computer 16 calculates the intensities of a saturating region selection field $G_S'$ in the direction of slice selection, a saturating region selection field $G_R'$ in the direction of signal read and a saturating region selection field $G_p'$ in the direction of phase encode for use in the saturation sequence (step S4), and it evaluates the transmission frequencies $f_{S1}$, $f_{S2}$; $f_{R1}$ $f_{R2}$; and $f_{P1}$, $f_{P2}$ of saturating RF pulses $A_S1$, $A_S2$; $A_R1$, $A_R2$; and $A_P1$, $A_P2$ in the directions of the corresponding gradient fields (step S5). Here, all the saturating RF pulses are 90° pulses having flip angles of 90°.

The transmission frequencies $f_{\alpha1}$ and $f_{\alpha2}$ of each pair of saturating RF pulses, which are derived at the step S5, correspond to the amounts of frequency shifts from the central transmission frequency $f_0$ of the RF pulses A1 and A2 in the signal acquisition sequence and are expressed by the following:

$$f_{\alpha1} = (\gamma/2\pi) \cdot G_\alpha'(L_\alpha/2) + f_{sinc} \quad (3)$$

$$f_{\alpha2} = f_{\alpha1} \quad (4)$$

Here, $\gamma$ denotes the nuclear magnetic resonance ratio, $G_\alpha'$ the saturating gradient field ($\alpha = S$, R or P), $L_\alpha$ the field of view in the direction of the gradient field $G_\alpha$, and $f_{sinc}$ the sinc frequency of the saturating RF pulses. Besides, letting $L_\alpha'$ denote the size of a saturation region in the direction of $G_\alpha'$ the saturating gradient field $G_\alpha'$ is expressed by:

$$G_\alpha' = 4 \cdot f_{sinc}/\gamma L_\alpha'$$

Subsequently, the computer 16 sets the first phase encode magnitude for use in the signal acquisition sequence (step S6).

Thenceforth, the sequence controller 15 executes the pulse sequence in FIG. 3 on the basis of the field control data of both the saturation sequence and the signal acquisition sequence transmitted from the computer 16, thereby to collect all predetermined image data.

First, according to the saturation sequence, spins in the saturation regions in the three directions (spins outside a region to be imaged, namely, a field of view) are excited, and they are dephased and saturated (step S7).

FIGS. 5(a)–5(d) are spin diagrams within the saturation region of the subject 1. In the initial state of FIG. 5(a) before the saturating RF pulses $A_\alpha1$, $A_\alpha2$ and the saturating gradient field $G_\alpha'$ are applied, the spins within the subject 1 are in a thermal equilibrium state conforming to a magnetostatic field and are allined in a vertical direction as indicated by an arrow.

Here, when the saturating RF pulses (90° pulses) $A_\alpha1$ and $A_\alpha2$ and the saturating gradient field $G_\alpha'$ are applied excite the saturation region, the spins of the saturation region fall 90° as shown in FIG. 5(b). Further, when the saturating gradient field $G_\alpha'$ is kept applied, the spins of the saturation region dephased as shown in FIG. 5(c). Eventually, almost all spin components disappear as shown in FIG. 5(d), so that the spins within the saturation region do not contribute to the magnetic resonance signal B in the signal acquisition sequence.

FIG. 6 is an explanatory diagram showing the saturation regions $L_\alpha1'$ and $L_\alpha2'$ in the direction of the gradient field $G_\alpha$. The Saturation regions located in both the sides of the imaging region $L_\alpha$ having a center frequency equivalent to the frequency $f_0$ are defined by the corresponding saturating RF pulses $A_\alpha1$ and $A_\alpha2$ which have bands of $2 \times f_{sinc}$ centered at the transmission frequencies $f_{\alpha1}$ and $f_{\alpha2}$, respectively, and the saturating gradient field $G_\alpha'$ the field intensity of which corresponds to a resonance frequency f.

Figure 7A:
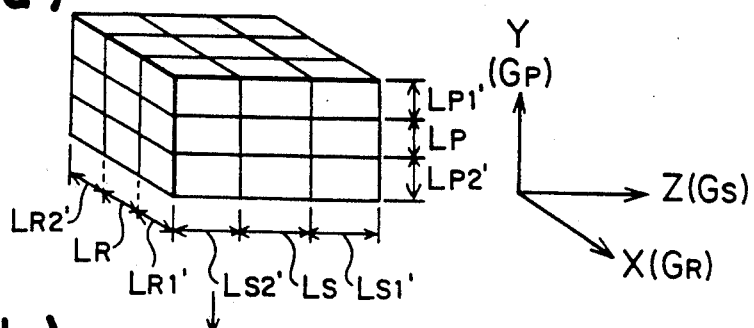
FIGS. 7(a), 7(b), 7(c), 7(d) and 7(e) are explanatory diagrams showing saturation regions in several directions as based on the saturation sequence, in three dimensions.
Figure 7B:
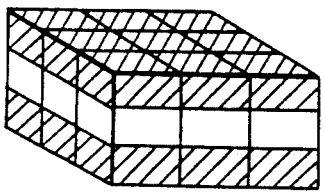
Figure 7C:
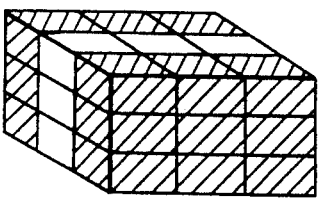
Figure 7D:
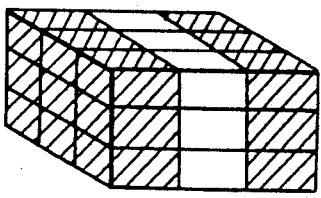
Figure 7E:
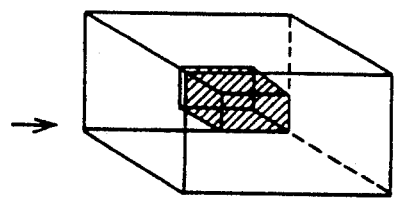

FIGS. 7(a)–7(e) are explanatory diagrams in which the fields of view $L_S$, $L_R$ and $L_p$ in the directions of the individual gradient fields and the respective saturation regions $L_S1'$, $L_S2'$; $L_R1'$, $L_R2'$; and $L_p1'$, $L_p2'$ adjoining them are depicted by rectangular prism for the sake of convenience. FIG. 7(a) shows the initial state before the execution of the saturation sequence, FIGS. 7(b)–7(d) show the saturation regions (hatched parts) in the directions of the respective gradient fields, and FIG. 7(e) shows the region of interest (hatched part).

In FIG. 3 and FIGS. 7(a)–7(e), the saturating operations in the saturation sequence are performed in the order of the phase encode direction, signal read direction and slice direction. Of course, however, equal results are obtained in any order of the saturating operations.

First, while the saturating region selection field $G_p'$ is applied, the saturating RF pulse $A_p1$ is impressed, whereby the spins of the saturation region $L_p1'$ in the phase encode direction are brought down 90°. Subsequently, the saturating right angled RF pulse $A_p2$ is impressed to flip the spins of the saturation region $L_p2'$. Thus, the spins of the saturation regions $L_p1'$ and $L_p2'$ indicated by the hatched parts in FIG. 7(b) are excited.

On this occasion, the transmission frequencies $f_{p1}$ and $f_{p2}$ of the respective saturating RF pulses $A_p1$ and $A_p2$ are expressed as follows in conformity with Eqs. (3) and (4):

$$f_{p1} = (\gamma/2\pi) \cdot G_p'(L_p/2) + f_{sinc}$$

$$f_{p2} = f_{p1}$$

where $G_p' = 4\pi \cdot f_{sinc}/\gamma L_p'$ holds.

Thereafter, the saturating region selection field $G_p'$ is kept applied (a hatched part in FIG. 3), whereby as illustrated by the change states from FIG. 5(c) to FIG. 5(d), the spins of the saturation regions $L_p1'$ and $L_p2'$ are dephased, so that the vertical components of the spins are slight.

Likewise, while the saturating region selection field $G_R'$ is applied, the saturating RF pulses $A_{R1}$ and $A_{R2}$ are impressed, whereby the spins of the saturation regions $L_R1'$ and $L_R2'$ in the signal read direction are brought down 90° as indicated by the hatched parts in FIG. 7(c). Further, the spins of the saturation regions $L_R1'$ and $L_R2'$ are dephased drastically by the saturating field $G_R'$, which corresponds to a hatched part in FIG. 3.

On this occasion, the transmission frequencies $f_{R1}$ and $f_{R2}$ of the respective RF pulses $A_{R1}$ and $A_{R2}$ are expressed by:

$$f_{R1} = (\gamma/2\pi) \cdot G_R'(L_R/2) + f_{sinc}$$

$$f_{R2} = f_{R1}$$

where $G_R' = 4\pi \cdot f_{sinc}/\gamma L_R'$ holds.

Besides, while the saturating region selection field $G_S'$ is applied, the saturating RF pulses $A_{S1}$ and $A_{S2}$ are impressed, the spins of the saturation regions $L_S1'$ and $L_S2'$ in the slice direction are brought down 90° as indicated by the hatched parts in FIG. 7(d). Further, the spins of the saturation regions $L_S1'$ and $L_S2'$ are dephased effectively by the saturating field $G_S'$ which corresponds to a hatched part in FIG. 3.

On this occasion, the transmission frequencies $f_{S1}$ and $f_{S2}$ of the respective saturating RF pulses $A_{S1}$ and $A_{S2}$ are expressed by:

$$f_{S1} = (\gamma/2\pi) \cdot G_S'(L_S/2) + f_{sinc}$$

$$f_{S2} = f_{S1}$$

where $G_S' = 4\pi \cdot f_{sinc}/\gamma L_S'$ holds.

Here, the field of view $L_S$ in the slice direction corresponds to the region of interest which is selected in the single-slice mode and the multislice mode.

In saturating steps of three directions, the spins within the saturation regions are dephased by applying the every prolonged saturating gradient field expressed by the hatched parts. Therefore, they are reliably saturated without the mutual influences between the individual saturation regions based on the respective saturating steps.

When the saturation sequence (the step S7) has completed in this way, a rectangular prism composed of the regions of interest $L_S$, $L_R$ and $L_p$ is defined and is left unsaturated as indicated by the hatched part in FIG. 7(e). Thereafter, the ordinary signal acquisition sequence is carried out to collect the magnetic resonance signals B of the respective slices similarly to the prior art (step S8 in FIG. 4).

At this time, the spins in the field of view and the saturation regions experienced 90° RF pulse A1, but only the spins in the field of view contribute to the magnetic resonance signal B for constructing the image. The reason is that the spins in the saturation regions have almost no net component as illustrated in FIG. 5(d) and cannot contribute to the magnetic resonance signal B. In a later imaging operation, accordingly, the images of the saturation regions do not overlap the field of view, and artifacts are suppressed.

In the multislice imaging mode the magnetic resonance signals B are successively received while the transmission frequency of the RF pulses A1 and A2 is being shifted in accordance with the slice pitches $\Delta s$. Usually, the longitudinal relaxation time $T_1$ of the spins to be imaged is ranged from several hundred milliseconds to 1 second—which is longer than each repetition time (several tens milliseconds) in the multislice signal acquisition sequence. As illustrated in FIG. 3, therefore, a plurality of signal acquisition is permitted following to single saturation sequence. Accordingly, within the time interval of several hundred milliseconds lapses from the initiation of the saturation sequence, the saturation sequence may be executed again.

Thereafter, whether or not the signal acquisition corresponding to the phase encode matrix $N_p$ has finished is checked (step S9 in FIG. 4). Unless it has completed, the next phase encode magnitude is set (step S10 in FIG. 4), whereupon the control flow is returned to the step S7. On the other hand, if it has fulfilled the images of the respective slices are reconstructed (step S11 in FIG. 4), and the reconstructed image is displayed on the image display unit 18 (step S12 in FIG. 4), whereby the imaging pulse sequence is ended.

As a result, the spins outside the region of interest or the field of view exert no influence, and the good tomographic image with the artifacts suppressed is obtained.

By way of example, even when a fluid (such as blood) outside the field of view flows into the FOV, if the spins of the fluid have been saturated in advance, they will not contribute to the magnetic resonance signal B.

Figure 8:
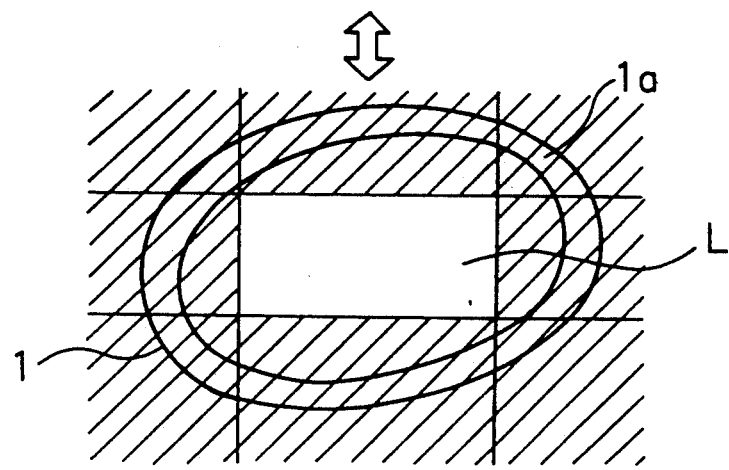
FIG. 8 is an explanatory diagram showing a case where an artifact ascribable to the spin of the body surface of a subject is suppressed.

Moreover, assuming that a fat layer 1a near the body surface of the subject 1 is selected to the saturation region (a hatched part) as shown in FIG. 8, it is possible to suppress the magnetic resonance signal B from the fat layer 1a as usually generating a comparatively high one though this layer is outside the region of interest L. Further, even when the abdomen of the subject 1 need the body surface thereof moves due to respiration or the like as indicated by an arrow in FIG. 8, the image quality of region of interest L is not affected, and artifacts due to body motion can be similarly suppressed.

Figure 9:
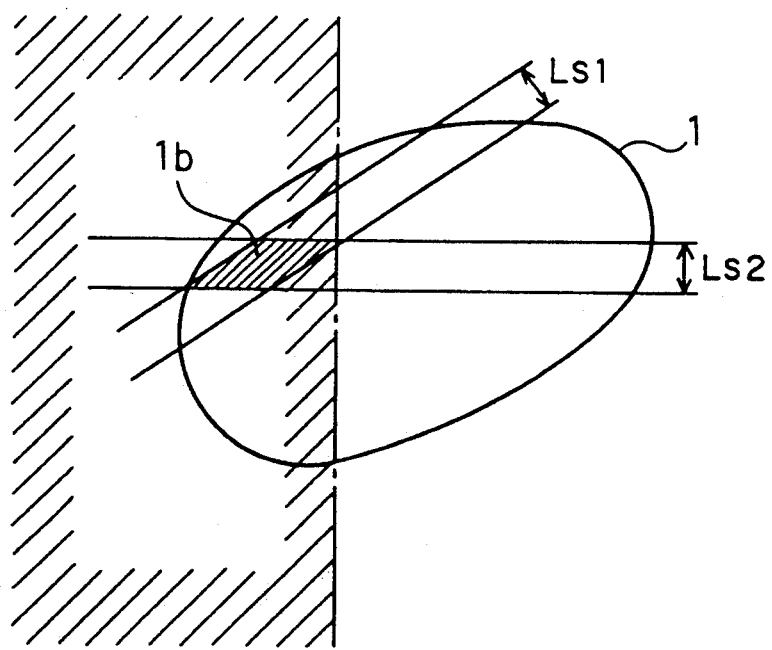
FIG. 9 is an explanatory diagram showing a case where an artifact ascribable to the overlapping part of slices in multislice imaging is suppressed.

Likewise, assuming that the overlapping part 1b of the first slice $L_S1$ and the second slice $L_S2$ in the case of multi-angle-multi-slice mode is the saturation region (a hatched part) as shown in FIG. 9, artifacts ascribable to the magnetic resonance signal B from the overlapping part 1b can be suppressed.

Since, in this case, the embodiment can be realize with the prior-art system and merely by altering software, it does not especially incur increase in cost.

Although, in the above embodiment, the magnetic resonance signal B has been indicated as the spin echo signal, it may well be a gradient field echo signal which is received without applying the 180° pulse A2 by way of the slice field $G_S2$, an electron spin resonance signal, or the like. For example, also in high-speed imaging such as the gradient field echo technique which employs the RF pulse A1 of lower flip angle than 90°, and image free from artifacts can be obtained by the similar foregoing way of saturating regions outside the field of view before the signal aquisition sequence.

In the above, the signal acquisition sequence for the plurality of slices of the multislice imaging has been executed after one saturation sequence section, supposing the gap between the slices to be small. However, in a case of large inter-gap slice, a saturation sequence section for saturating the region of the gap may well be inserted.

Besides, the transmission frequencies of each pair of saturating RF pulses have been shifted symmetrically from the center frequency $f_0$ of the signal acquiring RF pulses. However, when the saturating gradient fields and the respective transmission frequencies of the saturating RF pulses are set as desired, the embodiment is also applicable to off-center slicing and off-center reading-out and achieves similar effects.

In addition, the saturation sequence has been executed for all the gradient field directions. Since, however, the saturation regions are defined according to a specified diagnostic region or to the incident direction of a movable object, any unnecessary saturating gradient field and saturating RF pulses to a direction in which no artifact can be created may well be omitted.

Yet in addition, although the case of constructing the image by the use of the two-dimensional Fourier transform method has been described, similar effects are achieved even by the three-dimensional Fourier transform method.

Further, although the case of constructing the tomographic image on the basis of the magnetic resonance signals B has been referred to, the embodiment is also applicable to a case of spectroscopy.

As thus far described, in the first embodiment, the execution of a signal acquisition sequence is preceded by the execution of a saturation sequence which applies a saturating region select field in the direction of phase encode and a pair of saturating RF pulses having transmission frequencies unequal to each other; a saturating region select field in the direction of signal read and a pair of saturating RF pulses having transmission frequencies unequal to each other; and a saturating region select field in the direction of slice and a pair of saturating RF pulses having transmission frequencies unequal to each other; and in which the saturating phase encode field, signal read field and slice field are further kept applied after the applications of the respectively corresponding pairs of saturating RF pulses; whereby spins outside a tomographic slice to be interested are dephased beforehand. In the signal acquisition sequence, therefore, the intensities of magnetic resonance signals attributing to the spins outside the slice of interest become conspicuously negligible. Accordingly, the embodiment is effective to provide a magnetic resonance imaging apparatus supplying a high quality tomographic image in which various artifacts ascribable to the spins outside the region of interest are suppressed.

The second embodiment of this invention to be described below concerns improvements in multislice imaging. More specifically, it is common practice that the order of gathering slice signal is fixed, and that the subject is sliced in succession from a slice SL1 lying at an end part. Therefore, when a movable object such as blood flows into a field of view during the signal acquisition of the diagnostically important slice SL1 by way of example, fluid spins contribute to a magnetic resonance signal B. This has led to the problem that artifacts appear and degrade the image quality, so the correct diagnosis cannot be done.

The second embodiment has been made for solving the problem as mentioned above, and it is intended to provide a magnetic resonance imaging apparatus which can suppress artifacts ascribable to the flow of a movable object into an important slice and can construct a tomographic image of high quality.

The second embodiment consists in that, while a radio frequency is being shifted, a signal acquisition sequence is executed to obtain a plurality of tomographic slices of a subject, and that the order of signal detection of the subject (a signal acquisition order) is determined in correspondence with the moving direction of a movable object to traverse each tomographic slice.

In this embodiment, multislice imaging is performed, and the respective tomographic slices are set so as to correspond to the moving direction of the movable object and to lastly acquire the signal of the slice important for a diagnosis. Thus, the spins of the movable object flowing into the important slice have already been excited, so that they give low signal intensities and hardly contribute to the magnetic resonance signal. Accordingly, a high quality tomographic image with fluid artifacts suppressed is obtained for the last slice.

Now, there will be exemplified a case where the magnetic resonance signals B of the slices of multislice imaging are received by the spin echo technique and where an image is constructed by the two-dimensional Fourier transform method. Incidentally, a magnetic resonance imaging apparatus to which this embodiment is applied is as shown in FIG. 1, and some of programs within the sequence controller 15 or the computer 16 in FIG. 1 may be replaced, or new programs may be added. In addition, since a signal acquisition apparatus employed in this embodiment is the same as the pulse sequence of the conventional multislice imaging, it shall not be illustrated here.

Figure 10:
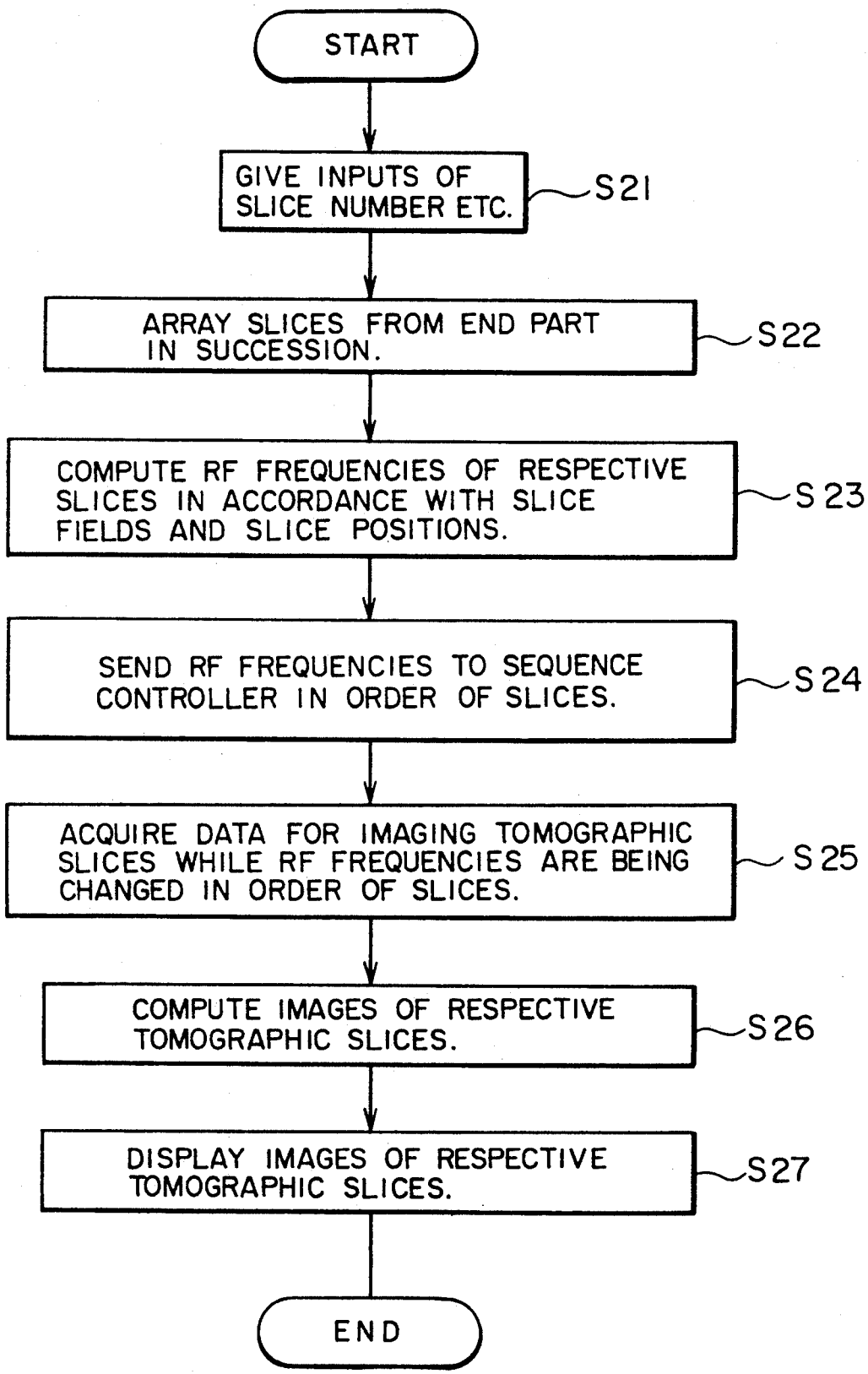
FIG. 10 is a flow chart showing the second embodiment of this invention.
Figure 11:
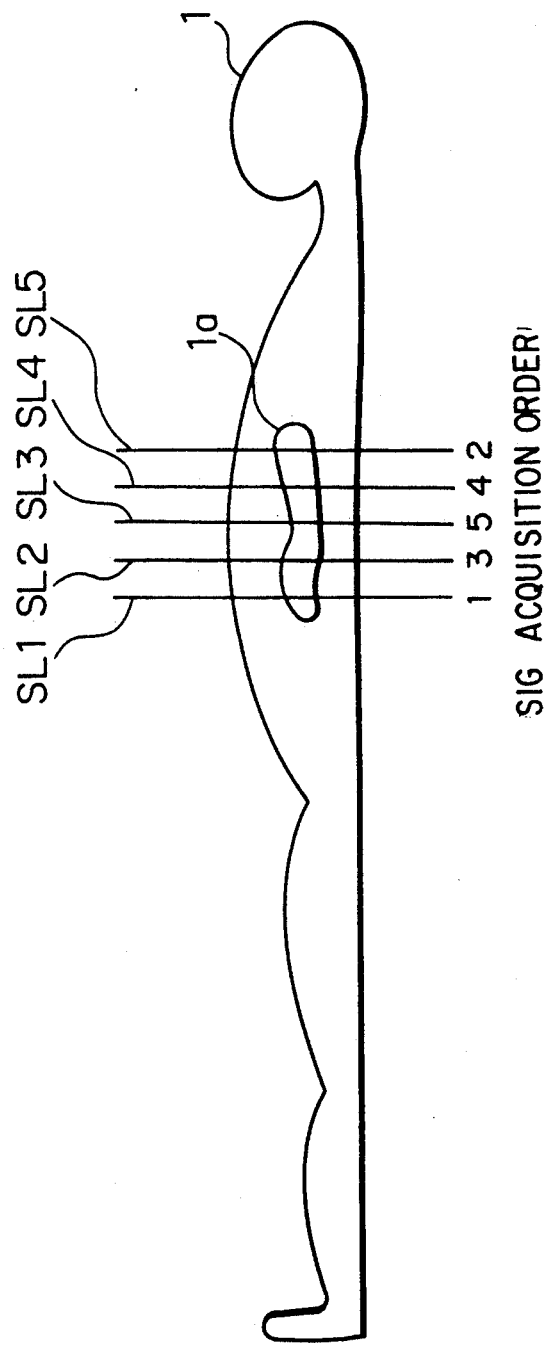
FIG. 11 is an explanatory diagram showing the signal acquisition sequence of multislice imaging in the second embodiment.

FIG. 10 is a flow chart of the second embodiment, while FIG. 11 is an explanatory diagram showing the signal acquisition order of individual slices according to the second embodiment.

First, the number of the tomographic slices, etc. are input to the computer 16 through the console 17 (step S21). Then, the computer 16 arrays the individual slices SL1-SL5 in succession from an end part on the basis of the initialized input values (step S22), and it computes the frequencies of RF pulses for the respective slices SL1-SL5 in accordance with a slice field $G_S$ and the positional coordinates of the slices SL1-SL5 (step S23).

Subsequently, the computer 16 determines the order of the slices so that the slice (for example, the third slice SL3) important for a diagnosis may have its signal acquired lastly, and it transmits the RF pulse frequencies corresponding to the respective slices, to the sequence controller 15 in the determined order of the slices (step S24). At this time, the RF pulse frequencies and the output order of the RF pulses A may well be transmitted to the sequence controller 15.

Thenceforth, on the basis of control data transmitted from the computer 16, the sequence controller 15 executes the multislice signal acquisition sequence while changing the RF pulse frequencies in the slice order of the slices SL1-SL5, thereby to collect all image data items for visualizing the respective tomographic slices (step S25).

In this case, the third slice SL3 which is the most important to the diagnosis must be lastly subjected to the signal acquisition. Therefore, the order of switching the RF pulse frequencies is set to be the order of the first slice SL1, fifth slice SL5, second slice SL2, fourth slice SL4 and third slice SL3 as indicated in FIG. 11. Accordingly, the sequence controller 15 delivers the RF pulses A1 and A2 of the frequencies corresponding to the respective slices, so as to collect the magnetic resonance signals B in the above order.

The computer 16 calculates the tomographic images of the respective slices SL1–SL5 (step S26), and displays them on the image display unit 18 (step S27). Then, the multislice imaging pulse sequence is ended.

In the signal acquisition sequence stated above, even when a movable object (for example, blood) having the same spins as those to-be-measured flow in from both regions outside the important slice SL3 of interest la, the movable spins have just been excited by the slicing operation of the adjacent slice and are not sufficiently relaxed. Accordingly, the spins of the movable object do not contribute to the magnetic resonance signal B during the signal acquisition of the inner slice SL3, and the artifacts suppressed tomographic image is constructed.

This function applies also to the slices SL2 and SL4 which lie inside the end slices SL1 and SL5, respectively. In the case where the signals are acquired successively from the outermost slices as indicated in FIG. 11, RF energy is effectively bestowed on the same spins as those to-be-measured, of the movable objects flowing in from both the outer sides, and hence, the intensities of the magnetic resonance signals B from the movable objects are lower in the inner slices.

In the above description of this embodiment, the signals have been acquired successively from the outermost side of the slices SL1–SL5. However, in a case where only the central slice SL3 plays good role for the diagnosis, the order of the intermediate slices may well be set at will as long as the slice SL3 is lastly formed.

Figure 12:
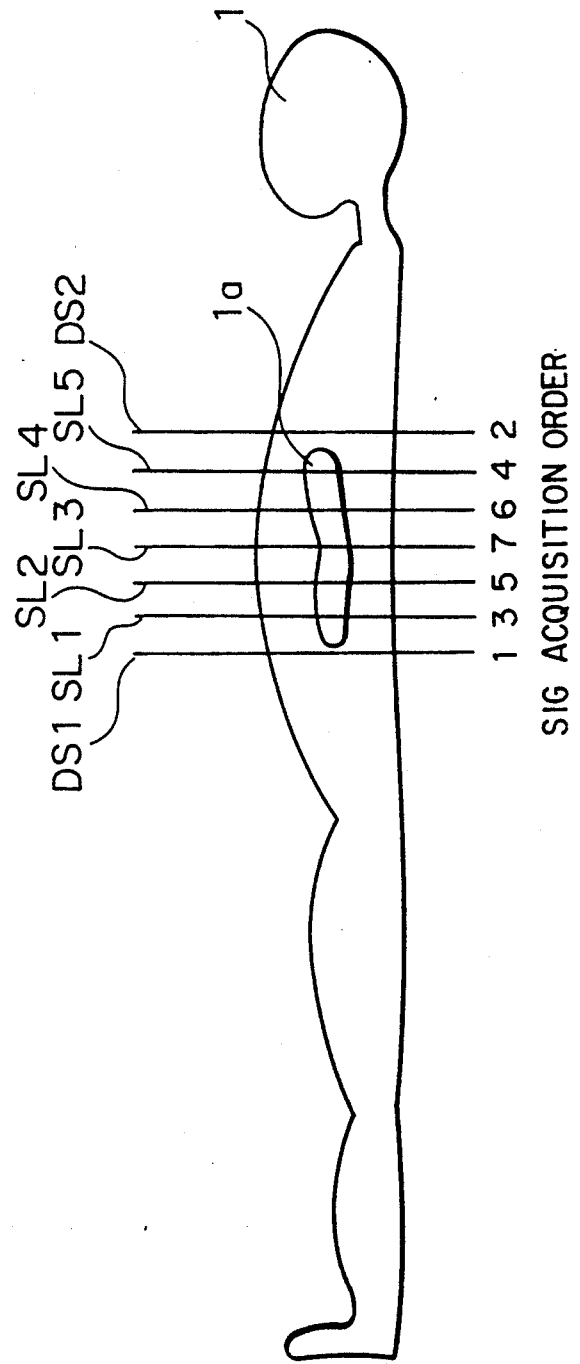
FIG. 12 is an explanatory diagram showing a signal acquisition sequence in the case where dummy slices are set.

Besides, in a case where also the images of the end side slices SL1 and SL5 are to be used for a precise diagnosis, dummy slices DS1 and DS2 may be further set outside the respective slices SL1 and SL5 and be first formed as in the above-stated signal acquisition sequence, as indicated in FIG. 12.

In this case, each of the dummy slices DS1 and DS2 may be irradiated with the RF pulses A by way of the slice field $G_S$ and need not have its signal especially acquired. Besides, the above aspect in which the single dummy slice is set on each of the outermost sides is not restrictive, but the fluid artifacts can be effectively suppressed when a plurality of dummy slices are set on each side in accordance with the switching intervals of the RF pulse frequencies, the speeds of the movable objects, etc.

Further, although the embodiment has referred to the case of the five slices, it is needless to say that similar effects are achieved when at least three slices are set, and yet, the central slice is the important slice.

Figure 13:
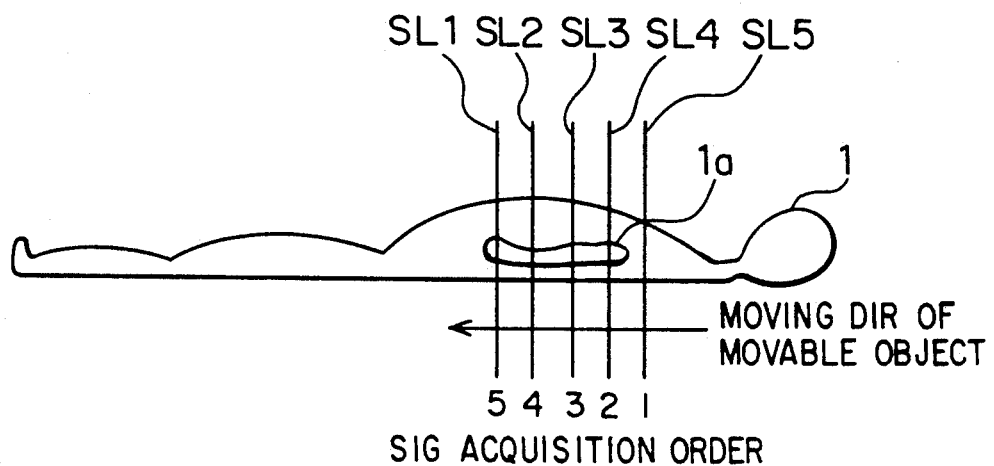
FIG. 13 is an explanatory diagram showing a signal acquisition sequence in the case where a movable object moves in one direction.

The subject 1 has been inspected in the order from the slices SL1 and SL5 at the side ends toward the slice SL3 at the central part. However, if the movable object moves in only one direction, the signals may be acquired in an order corresponding to the inflowing direction (arrow) as indicated in FIG. 13. Herein, it is more effective that the slice SL1 to be lastly formed is set as the most important slice. It is also allowed that a dummy slice (not shown) is set in front of the slice SL5 and is first formed.

Figure 14:
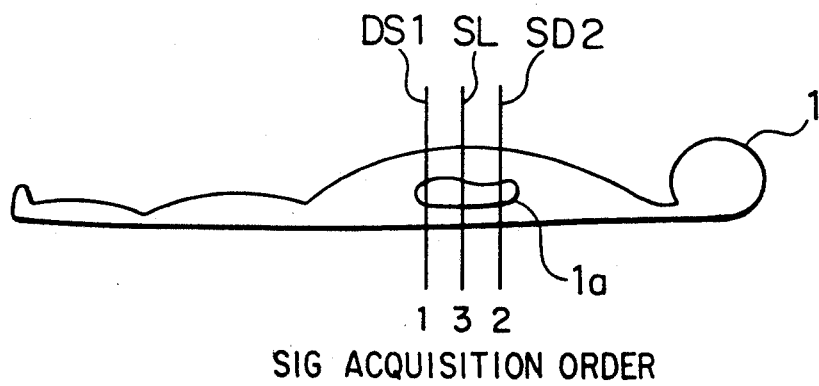
FIG. 14 is an explanatory diagram showing a signal acquisition sequence in the single slice case.

In the above, the case of the multislice imaging has been described. Needless to say, however, even when a single slice is to be imaged, similar effects are achieved in such a way that, as shown in FIG. 14, the dummy slices DS1 and DS2 are set on both sides of the slice SL and are first formed.

In addition, although the magnetic resonance signal B has been designated as the spin echo signal, it may well be replaced with a gradient field echo signal which is received without the 180° pulse A2 by way of the slice field $G_S3$, an electron spin resonance signal, or the like.

Yet in addition, although the case of constructing the image by the use of the two-dimensional Fourier transform method has been described, similar effects are achieved even by the three-dimensional Fourier transform method.

Further, although the embodiment has mentioned the case of constructing the tomographic image on the basis of the magnetic resonance signal B, it is also applicable to an imaging method in which spectroscopy is obtained by collecting the specified components of the magnetic resonance signal B.

As thus far described, according to the second embodiment, while an RF pulse frequency is being shifted, a signal acquisition sequence is executed to obtain a plurality of tomographic slices of a subject, and the order of signal detection of the subject (a signal acquisition order) is determined in correspondence with the moving direction of a movable object to traverse each tomographic slice, so as to lastly form the tomographic slice important for a diagnosis. Therefore, the spins of the movable object hardly contribute to a magnetic resonance signal during signal acquisition, and this brings forth the effect that a magnetic resonance imaging apparatus giving a high quality tomographic image with fluid artifacts suppressed is provided.

The third embodiment of this invention to be described below is intended to prevent the disorder of the phases of spins within a tomographic slice, thereby to suppress fluid artifacts. It consists in that a dummy sequence which includes an RF pulse but which does not include a slice field is cyclically executed between the adjacent ones of a plurality of sections of signal acquisition sequence, whereby the spins of a fluid to flow into a tomographic slice are saturated.

In this embodiment, the spins in a radio-frequency coil are cyclically saturated by the dummy sequence, and the predetermined signal acquisition sequence is executed at the point of time at which the spins of a fluid are kept saturated and at which desired spins in the tomographic slice are substantially relaxed. Thus, the spins of the fluid to enter the tomographic slice cannot absorb the radio-frequency energy of a RF pulse for signal reading and only a magnetic resonance signal based on the desired spins within the tomographic slice is received. Accordingly, the sufficiently high intensity magnetic resonance signal is received, and artifacts are suppressed to prevent from degrading an image quality. Besides, the processing of imaging need not be repeated, and the flip angle of the RF pulse can be set at will, so that high-speed imaging can also coped with.

Now, the third embodiment will be described with reference to the drawings. Incidentally, a magnetic resonance imaging apparatus to which this embodiment is applied is as shown in FIG. 1, and the content of the sequence controller 15 and parts of an operating program in the computer 16 may be altered. In addition, since a signal acquisition sequence employed in this embodiment is the same as the pulse sequence of the conventional multislice imaging, it shall not be illustrated here.

FIG. 15(A) is a pulse sequence diagram showing a dummy sequence which is executed in the third embodiment. The dummy sequence is cyclically executed between the repeated sections of the signal acquisition sequence. The cycles of the execution of the dummy sequence are set in accordance with the vertical relaxation time of fluid spins to-be-saturated and with the vertical relaxation time of spins to-be-imaged in a tomographic slice.

The third embodiment will now be described by taking as an example where a magnetic resonance signal B is received by the gradient field echo technique and where an image is constructed by the two-dimensional Fourier transform method.

First, the dummy sequence in FIG. 15(A) is executed before the execution of the first section of the signal acquisition sequence. In the dummy sequence, an RF pulse A' similar to an RF pulse A in the signal acquisition sequence is applied, but a slice field $G_S$ is not applied.

More specifically, the RF pulse A' of flip angle $\alpha$ (for example, 90° or less) having a center frequency and a band width as predetermined is impressed on the subject 1. Thus, inside the radio-frequency coil 4, the spins of an extensive region including a tomographic slice are supplied with radio-frequency energy and are saturated.

Thereafter, a signal read field $G_R$ and a phase encode field $G_p$ are applied. Since, however, the magnetic resonance signal B is not received, the gradient fields $G_R$ and $G_p$ are applied. In this regard, when the gradient fields $G_R$ and $G_p$ are applied, audible sounds are generated by electromagnetic interactions, and hence, the execution of the dummy sequence can be readily acknowledged. It is accordingly possible to eliminate the anxiety of the subject, namely, patient 1.

Subsequently, the signal acquisition sequence shown in FIG. 15(B) is executed after a repetition time TR since the dummy sequence. It is assumed here that the vertical relaxation time of the spins of blood is 1.2 second, that the vertical relaxation time of the spins of internal organs is 500 milliseconds, and that the repetition time TR is 40 milliseconds–50 milliseconds. Then, when the RF pulse A of the signal acquisition sequence has been impressed, the spins of the blood flowing into the tomographic slice are in the saturated states and cannot absorb radio-frequency energy. Accordingly, they do not generate a high intensity magnetic resonance signal. On the other hand, the spins in the tomographic slice fall into steady states based on SSFP (Steady State Free Procession), and they can absorb the radio-frequency energy of the RF pulse A and generate the magnetic resonance signal B of sufficiently high intensity.

The above sequences are repeatedly executed as in the foregoing, whereby a desired tomographic image with fluid artifacts suppressed is constructed. Since, on this occasion, the intensity of the received magnetic resonance signal B is high, the image quality which is constructed by one imaging operation is enhanced, and the image construction processing need not be repeated. Moreover, since the flip angle $\alpha$ can be set at any desired low angle, high-speed imaging can be coped with.

Besides, since the dummy sequence is executed so as to fix the application time intervals TR of the RF pulses A and A', the spins to be imaged are not saturated in excess. Further, the flip angles $\alpha$ of the RF pulses A and A' are set at any desired angles in accordance with the internal organ to-be-measured.

By the way, the third embodiment has mentioned the case where the dummy sequence is executed each time the signal acquisition sequence is executed. However, the spins of the blood exhibit a long vertical relaxation time, and once saturated, they are not recovered in a short time, so that the dummy sequence need not be executed each time. Accordingly, the dummy sequence may be executed at least once between (or before or after) a plurality of sections of the signal acquisition sequence.

The execution cycle of the dummy sequence depends upon, for example, the vertical relaxation time $T_1$ and inflowing speed of the fluid, and it can be set at a long cycle if the vertical relaxation time $T_1$ is long or the inflowing speed is low. In the aforementioned case where the fluid is the blood, the vertical relaxation time is 1.2 second, and the inflowing average speed is about 25 cm/second. Therefore, assuming the space of the radio-frequency coil 4 to extend over ±25 cm, the fluid artifacts can be satisfactorily suppressed merely by executing the dummy sequence at a rate of one cycle per second.

In the above, the dummy sequence has been executed directly before the execution of the first section of the signal acquisition sequence. Since, however, the influence of the fluid spins is negligible in the initial state, the first cycle of the dummy sequence may well be executed after the first section of the signal acquisition sequence.

In addition, although the case of constructing the image by the use of the two-dimensional Fourier transform method has been described, similar effects are achieved even by the three-dimensional Fourier transform method.

Yet in addition, although the embodiment has mentioned the case of receiving the gradient field echo signal as the magnetic resonance signal B, another magnetic resonance signal, for example, a spin echo signal, an electron spin resonance signal, or the like may well be used.

Further, although the embodiment has mentioned the case of constructing the tomographic image on the basis of the magnetic resonance signal B, it is also applicable to an imaging method in which spectroscopy is obtained by collecting the specified components of the magnetic resonance signal B.

As thus far described, according to the third embodiment, a dummy sequence which includes an RF pulse but which does not include a slice field is cyclically executed between a plurality of sections of signal acquisition sequence, whereby the spins of a fluid to flow into a tomographic slice are saturated. Therefore, the magnetic resonance signal of spins in the desired tomographic slice can be received at a high intensity without disturbing the phases of the spins, and this brings forth the effect that a magnetic resonance imaging method which suppresses fluid artifacts to improve an image quality and which can cope with high-speed imaging is provided.

With the intention of preventing the disorder of the phases of spins within a tomographic slice, thereby to avoid lowering in the intensity of a magnetic resonance signal and to avoid degradation in the quality of an image, the fourth embodiment of this invention to be described below comprises, before acquiring the magnetic resonance signal, the first step of making uniform the phases of spins in fore and hinder regions inclusive of the tomographic slice, and the second step of increasing or decreasing the flip angle of the spins in only the tomographic slice, and besides, saturating the spins in the fore and hinder regions exclusive of the tomographic slice.

In this embodiment, the spins of a fluid to enter the tomographic slice are saturated, thereby to acquire only the magnetic resonance signal from the desired tomographic slice and to prevent the intensity of the magnetic resonance signal from lowering.

Figure 16:
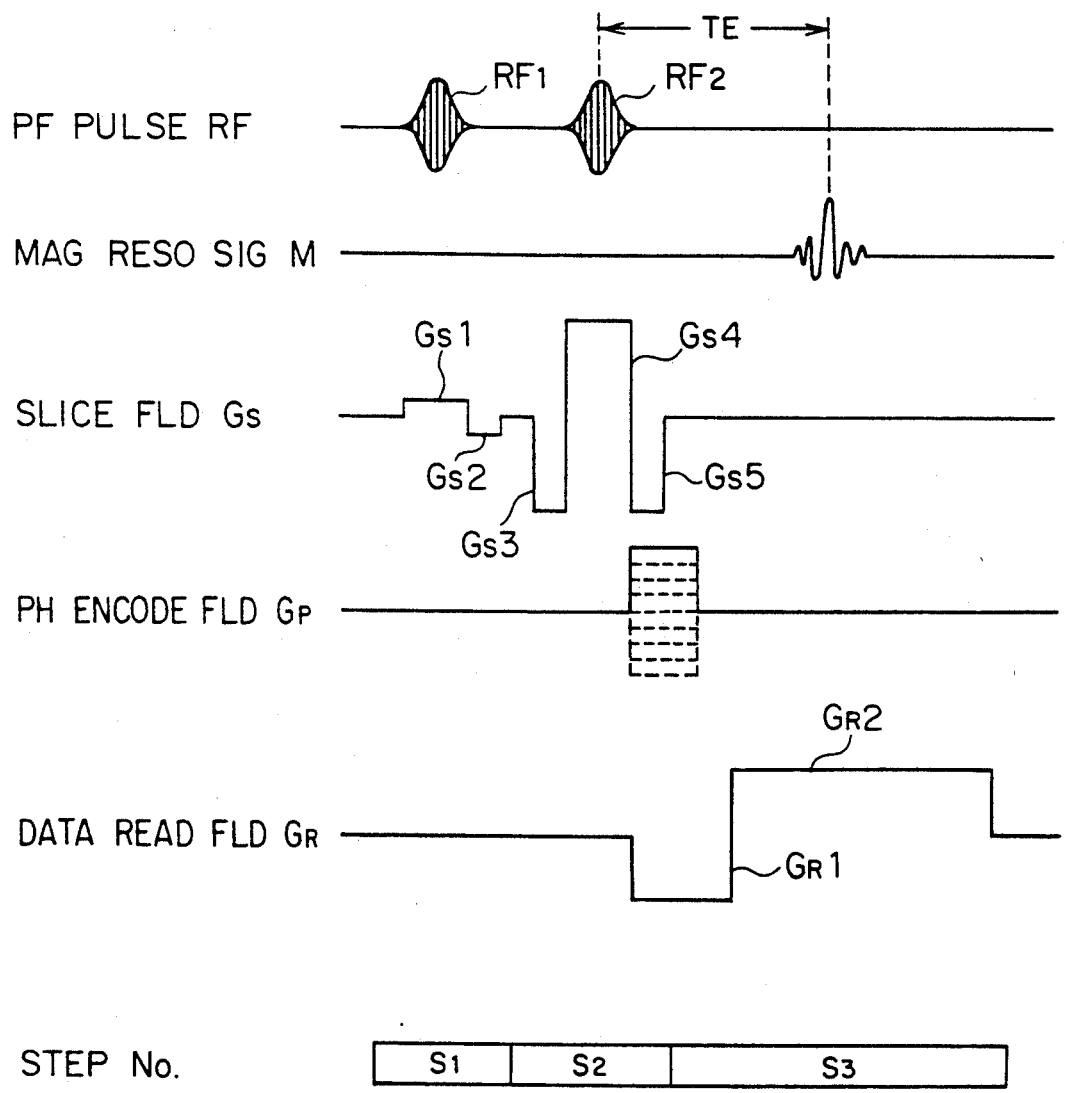
FIG. 16 is a pulse sequence diagram showing the operation of the fourth embodiment of this invention.

Now, the fourth embodiment will be described with reference to the drawings. FIG. 16 is a pulse sequence diagram of this embodiment, while FIG. 17 is a flow chart thereof.

Figure 17:
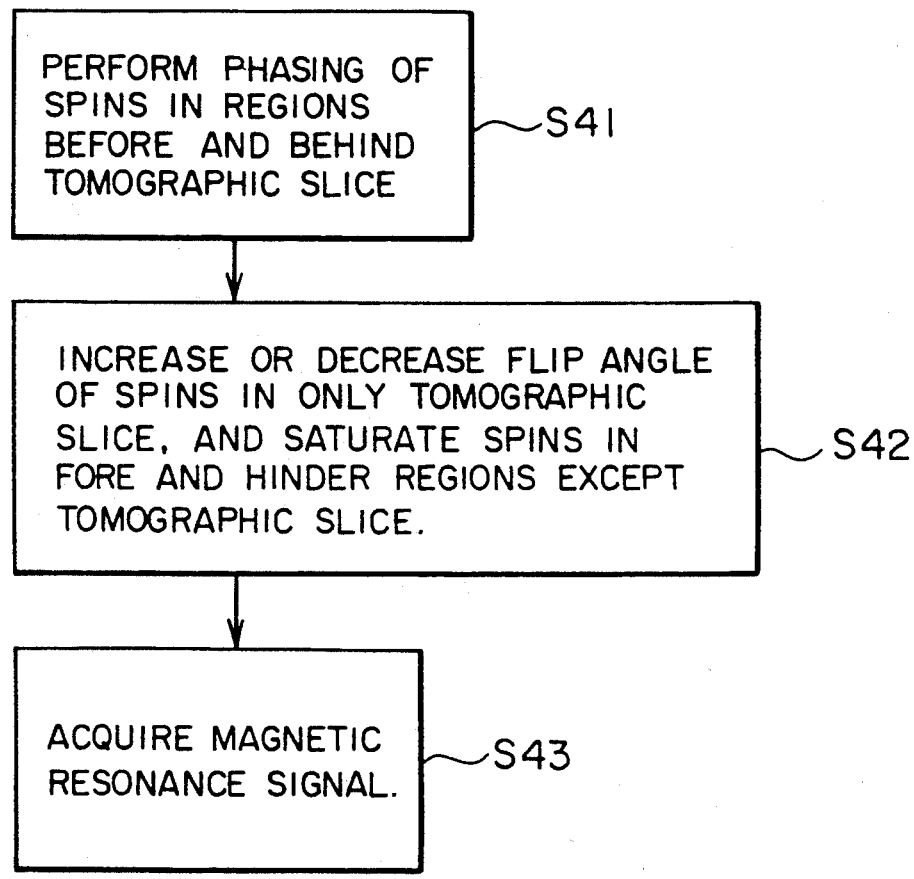
FIG. 17 is a flow chart in the fourth embodiment.

First Step S41 (FIG. 17)

The first radio-frequency field pulse $RF_1$ which is selective and which has a flip angle $\beta$ (for example, 35°) is projected on the subject (1 in FIG. 1) inside the radio-frequency coil (4), and simultaneously, a slice field $G_{S1}$ of low field intensity is applied in a direction perpendicular to a tomographic slice. The intensity of the slice field $G_{S1}$ on this occasion is about 1/10 of that of a slice field of high field intensity (to be described later). Thus, the spins of fore and hinder regions inclusive of the tomographic slice are brought down in the amount of $\beta$.

Subsequently, after the projection of the first radio-frequency field pulse $RF_1$, a slice field $G_{S2}$ the polarity of which is inverted to that of the slice field $G_{S1}$ is applied in order to make uniform the spin phases of lateral magnetization disordered by the slice field $G_{S1}$. As a result, all the spins in the fore and hinder regions inclusive of the tomographic slice have their phases made uniform.

Second Step S42

First, a slice field $G_{S3}$ in the inverted polarity is applied. Subsequently, while the second radio-frequency field pulse $RF_2$ which is selective and which has a flip angle $\alpha$ (for example, 35°) is kept projected, the slice field $G_{S4}$ of high field intensity is applied. Further, a slice field $G_{S5}$ in the inverted polarity is applied.

Thus, the flip angle of the spins in only the desired tomographic slice is increased, and the spins in the fore and hinder regions exclusive of the tomographic slice have their phases of lateral magnetization disordered and are saturated because they have been given the flip angle $\beta$ by the first radio-frequency field pulse $RF_1$.

On this occasion, the second radio-frequency field pulse $RF_2$ assumes its peak at the middle point of the slice field $G_{S4}$, and the disorder of the phases in the first half of the slice field $G_{S4}$ is corrected by the slice field $G_{S3}$ of the inverted polarity, while the disorder of the phases in the latter half is corrected by the slice field $G_{S5}$ of the inverted polarity.

Third Step S43

Thereafter, as in the foregoing, a phase encode field $G_p$ and signal read fields $G_{R1}$ and $G_{R2}$ are applied, whereby a magnetic resonance signal M formed of a spin echo signal is acquired after an echo time TE.

The sequence consisting of the above steps S41–S43 is repeated N times while the phase encode field $G_p$ is being changed systematically, and the N magnetic resonance signals M thus acquired are Fourier-transformed, thereby to obtain the image of the desired tomographic slice.

Here, even when blood flows in from the region outside the tomographic slice, the spins thereof do not contribute to the magnetic resonance signal M because they have been saturated by the radio-frequency field pulses $RF_1$ and $RF_2$. Moreover, the spins in the tomographic slice do not lower the intensity of the magnetic resonance signal M on account of the disorder of their phases, etc. Furthermore, since the radio-frequency field pulse $RF_1$ does not require a wide band and a high power level as in the prior art, the consumption of electric power can be saved.

Incidentally, although the embodiment has referred to the two-dimensional Fourier transform method, similar effects are achieved even with the three-dimensional Fourier transform method.

In addition, although the flip angles $\alpha$ and $\beta$ have been set at 35°, respectively, it is needless to say that they are set at any desired angles in accordance with an internal organ to-be-measured.

Yet in addition, although the embodiment has exemplified the case where the magnetic resonance signal M is the spin echo signal based on the nuclear magnetic resonance, similar effects are achieved even in case of applying the electron spin resonance.

Further, the embodiment has been described as to the case where the sequence consisting of the first step S41–third step S43 is repeated N times, thereby to construct the single image, but it may well be applied to multislice imaging. In this case, the magnetic resonance signal M of another tomographic slice in a region which is not irradiated with the first radio-frequency field pulse $RF_1$ by the first step S41 can be acquired by properly controlling the intensity of the slice field $G_S$ during the application of the first radio-frequency field pulse $RF_1$ and the frequency of the second radio-frequency field pulse $RF_2$.

As thus far described, according to the fourth embodiment, before the acquisition of a magnetic resonance signal, only spins in regions outside a tomographic slice are saturate without dephasing spins in the tomographic slice. This brings forth the effect that a magnetic resonance imaging apparatus which can suppress artifacts ascribable to a fluid such as blood and can improve an image quality is provided.

What is claimed is:

1. An artifact suppression system for a magnetic resonance imaging apparatus, comprising static field application means for applying a static field to a subject, RF pulse application means for applying RF pulses, gradient field application means for applying gradient fields which consist of a slice field for designating a tomographic slice, a phase encode field for affording a phase encode magnitude, and signal read field for encoding a frequency, and sequence control means for controlling a signal acquisition sequence which acquires a magnetic resonance signal from the designated tomographic slice of the subject, and a saturation sequence which saturates spins of movable objects to traverse the designated tomographic slice of the subject for the signal acquisition, before execution of said signal acquisition sequence;

wherein said saturation sequence of said sequence control means applies;
  (a) a saturating region select field in the direction of phase encode, and a pair of saturating RF pulses having transmission frequencies unequal to each other,
  (b) a saturating region select field in the direction of signal read, and a pair of saturating RF pulses having transmission frequencies unequal to each other, and (c) a saturating region select field in the direction of slice, and a pair of saturating RF pulses having transmission frequencies unequal to each other, and it further applies the prolonged dephasing magnetic field after the applications of the respective pairs of saturating RF pulses.

2. An artifact suppression system for a magnetic resonance imaging apparatus, comprising static field application means for applying a static field to a subject, RF pulse application means for applying RF pulses, gradient field application means for applying gradient fields which consist of a slice field for designating a tomographic slice, a phase encode field for affording a phase encode magnitude, and signal read field for encoding a frequency, and sequence control means for controlling a signal acquisition sequence which acquires a magnetic resonance signal from the designated tomographic slice of the subject, and a saturation sequence which saturates spins of movable objects to traverse the designated tomographic slice of the subject for the signal acquisition, before execution of said signal acquisition sequence;

wherein said signal acquisition sequence of said sequence control means slices the subject a plurality of times and acquires the respective magnetic resonance signals from a plurality of tomographic slices, and it has an order of said tomographic slices determined in correspondence with a moving direction of the movable object to traverse said tomographic slices.

3. An artifact suppression system for a magnetic resonance imaging apparatus as defined in claim 2, wherein the order of said tomographic slices is so set that the tomographic slice which is the most important for a diagnosis of the subject lies last.

4. An artifact suppression system for a magnetic resonance imaging apparatus, comprising static field application means for applying a static field to a subject, RF pulse application means for applying RF pulses, gradient field application means for applying gradient fields which consist of a slice field for designating a tomographic slice, a phase encode field for affording a phase encode magnitude, and signal read field for encoding a frequency, and sequence control means for controlling a signal acquisition sequence which acquires a magnetic resonance signal from the designated tomographic slice of the subject, and a saturation sequence which saturates spins of movable objects to traverse the designated tomographic slice of the subject for the signal acquisition, before execution of said signal acquisition sequence;

wherein said sequence control means repeats said signal acquisition sequence as a plurality of sections while changing the phase encode magnitude, and a dummy sequence which includes the RF pulse but which does not include the slice field is cyclically executed between the sections of said signal acquisition sequence.

5. An artifact suppression system for a magnetic resonance imaging apparatus as defined in claim 4, wherein the signal acquisition sequence and the dummy sequence are repeated at a rate which allows spins of body fluids to remain saturated while the spins of other body components have become substantially relaxed due to differences in the vertical relaxation time of various body components.

6. An artifact suppression system for a magnetic resonance imaging apparatus, comprising static field application means for applying a static field to a subject, RF pulse application means for applying RF pulses, gradient field application means for applying gradient fields which consist of a slice field for designating a tomographic slice, a phase encode field for affording a phase encode magnitude, and signal read field for encoding a frequency, and sequence control means for controlling a signal acquisition sequence which acquires a magnetic resonance signal from the designated tomographic slice of the subject, and a saturation sequence which saturates spins of movable objects to traverse the designated tomographic slice of the subject for the signal acquisition, before execution of said signal acquisition sequence;

wherein said sequence control means comprises, before the acquisition of the magnetic resonance signal, the first step of making uniform, phases of spins in fore and hinder regions inclusive of the tomographic slice of the subject, and the second step of changing flip angles of the spins in only the tomographic slice and saturating the spins in the fore and hinder regions exclusive of the tomographic slice.

7. An artifact suppression system for a magnetic resonance imaging apparatus as defined in claim 6, wherein said first step consists of a section in which a first RF pulse being selective is applied together with a slice field of low field intensity, and a section in which a slice field being opposite in polarity to the low-intensity slice field is applied subsequently to said low-intensity slice field, and said second step consists of a section in which a second RF pulse being selective is applied together with a slice field of high field intensity, and sections in which slice fields in the opposite polarity are respectively applied before and after the high-intensity slice field.

8. An artifact suppression system for a magnetic resonance imaging apparatus as defined in claim 7, wherein the intensity of said low-intensity slice field is about 1/10 of that of said high intensity slice field.

* * * * *

UNITED STATES PATENT AND TRADEMARK OFFICE
CERTIFICATE OF CORRECTION

PATENT NO. : 5,159,550

DATED : October 27, 1992

INVENTOR(S) : Sakamoto et al.

It is certified that error appears in the above-identified patent and that said Letters Patent is hereby corrected as shown below:

On the title page and col. 1, line 1 change "ROSONNANCE" to --RESONANCE--.

Item no. 57, Abstract, line 10, change "acquistion" to --acquisition--.

Signed and Sealed this

Fifth Day of October, 1993

Attest:

BRUCE LEHMAN

Attesting Officer

Commissioner of Patents and Trademarks